Oct. 20, 1959 E. F. LOSCO ET AL 2,909,453

PROCESS FOR PRODUCING SEMICONDUCTOR DEVICES

Filed July 23, 1956

WITNESSES

Edwin E. Bassler

Wm. B. Sellers.

INVENTORS
Ezekiel F. Losco &
Gene Strull
BY
Frederick Shapoe
ATTORNEY

United States Patent Office 2,909,453

Patented Oct. 20, 1959

2,909,453

PROCESS FOR PRODUCING SEMICONDUCTOR DEVICES

Ezekiel F. Losco, Whitehall Borough, and Gene Strull, Pittsburgh, Pa., assignors to Westinghouse Electric Corporation, East Pittsburgh, Pa., a corporation of Pennsylvania Application July 23, 1956, Serial No. 599,373

8 Claims. (Cl. 148—1.5)

This invention relates to novel processes for producing semiconductor devices, such as transistors.

Semiconductor devices, such as transistors, phototransistors and the like, have been produced by alloy fusion processed whereby to provide for emitter and collector junctions. Certain disadvantages are encountered in preparing such semiconductor devices by fusion procedures. A particularly critical feature that has been found desirable is that the emitter junction should be substantially planar with respect to an opposed collector junction. In fusion processes employing substantial thickness of fused material, the emitter junction tends to form with curved interface surfaces, particularly at the peripheral edges thereof. Furthermore, the depth of penetration of a thick mass of emitter doping impurity into a semiconductor material is difficult to control so that the separation between the emitter and collector junctions is not constant. Due to these relatively uncontrollable factors, the current gain is not constant with emitter current but tends to drop at high currents. Such characteristics limit the usefulness of transistors in power applications.

The object of this invention is to provide a process for preparing a semiconductor device having an emitter junction which is of substantially uniform depth and of planar configuration.

A further object of the invention is to provide a semiconductor device having an emitter junction which is substantially planar to which is affixed a layer of emitter contact material, and a fused collector junction upon whose surfaces the projection of the emitter junction comprises substantially parallel, planar surfaces.

A still further object of the invention is to provide a phototransistor comprising an evaporated emitter junction of a thickness transparent to light over substantially its entire surface, and a fused collector junction associated therewith.

Another object of the invention is to provide a process for simultaneously applying the emitter contact, the collector contact and the base contact in a semiconductor device.

Other objects of the invention will, in part, be obvious and will, in part, appear hereinafter. For a better understanding of the nature and objects of the invention, reference should be had to the following detailed description and drawing, in which.

Figure 2:
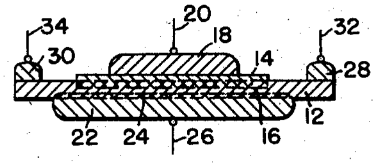
Fig. 2 is a cross section on line II—II of Fig. 1.

In accordance with this invention, it has been discovered that semiconductor devices, and particularly transistors and phototransistors, may be prepared by a relatively simple process whereby to provide a substantially planar emitter junction spaced at a predetermined distance from a fused collector junction. Briefly, the process comprises evaporating a thin layer of a thickness of less than 0.001 inch of a doping impurity material on a surface of a semiconductor member or wafer. The semiconductor wafer has a semiconductivity opposite to the type of semiconductivity which will be imparted thereto by the evaporated doping impurity material. The evaporated film is heated to a first temperature to cause the doping impurity to fuse and then diffuse into the adjacent surface of the semiconductor wafer to convert the surface layer to the opposite type of semiconductivity possessed by the body of the semiconductor wafer. The diffusion of the evaporated thin film may be readily controlled so that diffusion to a given depth occurs and a uniformly thick surface layer of the semiconductor wafer is changed in semiconductivity. Consequently, a substantially planar and uniform P–N junction is produced.

Thereafter, an alloy member having a liquidus temperature above the said first temperature is disposed upon this evaporated and fused layer of the semiconductor wafer to lie well within the periphery of the evaporated layer. A second alloy member having a liquidus temperature below the said first temperature is applied to another surface of the semiconductor wafer, ordinarily upon the surface immediately underneath the surface to which the evaporated layer was applied. Both the first alloy member and the second alloy member comprise the doping impurity material and the semiconductor material in proportions to provide the desired liquidus temperature. The second alloy member may comprise additional ingredients in order to reduce the liquidus temperature and to secure desired properties. Finally, a base contact comprising a solder that will melt at a temperature below the said first temperature is applied at a point on the surface of the wafer adjacent to but not touching the evaporated and fused layer. The assembly of the wafer, first and second alloy members and the base contact so produced is subjected to a temperature which is below the said first temperature, and when so heated, the first alloy member will fuse to the evaporated layer without, however, changing its characteristics. No substantial melting of the first alloy member takes place, and a firm, electrical and metallurgical bond is made with the evaporated and fused layer. The second alloy member will fuse, and the melt will penetrate into and diffuse into the adjacent surfaces of the semiconductor wafer and will change the semiconductivity of the wafer at such portions to produce a second P–N junction. The base contact solder will also fuse and make electrical contact with the semiconductor wafer. On cooling to room temperature, there is obtained a highly efficient semiconductor device.

The semiconductor member may comprise any suitable solid semiconductor material. Examples are germanium, silicon, germanium-silicon alloys, alloys of the elements of group III and group V of the periodic table, for example, gallium phosphide, aluminum antimonide, and indium arsenide, and compounds of elements of group II and group VI of the periodic table. It will be understood that the above examples are only illustrative and not exhaustive.

The semiconductor member will comprise a highly purified single crystal material doped to provide a given type of semiconductivity throughout the semiconductor material. Thus, the single crystal semiconductor material may be doped with a group III element, such as indium, to provide P-type semiconductivity therein or with a group V element, such as antimony, to provide N-type semiconductivity therein. The doped semiconductor material is suitably machined as by cutting with a diamond saw into wafers of a suitable size and thickness. The machined wafers are then etched to remove strained surface material, thereby providing a semiconductor wafer free from flaws. A suitable thickness of the semiconductor wafer, for example, of germanium or silicon, is from 4 to 10 mils. In some cases, as will be set forth hereinafter, thicker wafers having thicknesses of from 8 to 25 mils or more may be prepared, and then one or more grooves or depressions are machined in one surface thereof so that the bottom of the surface of the groove is from about 1 mil to 4 mils from the bottom surface of the wafer. These grooves are surrounded by a thick peripheral portion of the wafer which provides for strength and greatly reduces fragility with consequent breakage.

For evaporation on the surface of an N-type semiconductor member, particularly suitable doping materials are indium, gallium and aluminum, or mixtures of any two or all three. For P-type semiconductor materials, arsenic, antimony and phosphorus are particularly suitable. It will be understood that other doping impurities may be employed for evaporation upon the surface of the semiconductor wafers.

The doping impurity material is evaporated to a thickness of substantially less than 0.001 inch and preferably of the order of from 0.0001 to 0.00001 inch thickness. For phototransistors, the thickness of the evaporated material is not in excess of 0.0001 inch, and preferably is near 0.00001 inch in thickness. Films of such latter thicknesses have a high light transmission factor, and the phototransistors are sensitive over substantially the entire area.

It has been found critical to clean the surface of the semiconductor wafer with great care preceding the evaporation of the doping impurity film. The etching of the semiconductor wafers should be carefully carried out, and the etched wafers protected without being exposed to the atmosphere any more than is necessary. The etched semiconductor wafer is placed within an evacuated chamber and may be subjected to additional cleaning, for example, by glow discharge and bombarding the semiconductor surface with positive ions, the semiconductor wafer being cathodic. In addition, the doping impurity to be applied to the wafer is heated to evaporation temperatures with a shield interposed between the semiconductor wafer and the filament, crucible or other heat source. Thus, aluminum, indium or other doping impurity material, is heated to 850° C. for a period of time of 5 minutes with the shield in such intercepting position, so that impurities are volatilized off under a high vacuum of the order of $10^{-4}$ mm. Hg or lower. Higher or lower temperatures may be employed. Under these conditions, it has been found that low boiling impurities, which are present even in normally high purity doping material, are deposited on the shield. Observation shows a progressive brightening of the doping impurity material as the impurities are volatilized off. Within 5 minutes, the brightness of the doping impurity material, such as aluminum, in a tungsten coil, for example, reaches a maximum, and the shield can be withdrawn so that the doping impurity material will deposit on the desired surfaces of the semiconductor wafer. The temperature, distance between the heated doping impurity to the semiconductor wafer, and the time of evaporation control the thickness of the applied doping impurity layer on the semiconductor wafer. It will be understood that the semiconductor wafer is suitably masked to expose only desired surface areas to the evaporated doping material.

The semiconductor wafer with the evaporated layer of doping impurity is then heated to a temperature above the melting point of the doping impurity, but below the melting point of the semiconductor, preferably while still under vacuum, to diffuse the doping material into the adjacent surfaces of the semiconductor wafer. Because an extremely thin layer of the doping impurity material is present, the diffusion is subtantially uniform. A temperature is selected such that the diffusion proceeds an appreciable distance into the semiconductor wafer in a reasonable period of time of, for example, less than an hour. The doping impurity overwhelms the opposite type of semiconductivity at the surface of the semiconductor wafer on which the evaporated layer is present. The semiconductor material at the surface, therefore, is converted to the opposite type of semiconductivity. Diffusion progressively changes deeper and deeper portions of the semiconductor wafer to the type of semiconductivity opposite to the rest of the body of the wafer. The heating also causes some of the semiconductor material to diffuse into the evaporaten film. For a given diffusing temperature, an equilibrium between the semiconductor material and the doping impurity material is established within the entire evaporated film. This equilibrium results in an alloy of the two materials having a liquidus temperature corresponding to the diffusion temperature. It is critical that thereafter the semiconductor member be subjected to no temperature exceeding the diffusion temperature.

A first alloy member in film, foil or other suitable shape, is prepared from a mixture of the semiconductor material and the doping impurity material. The composition of this first alloy member should be selected such that the liquidus temperature of this first alloy member is above the diffusion temperature. Thus, for indium as the doping impurity material and germanium as the semiconductor material, a diffusion temperature of 500° C. results in an alloy comprising approximately 11 atom percent of germanium and 89 atom percent of indium being formed in the evaporated layer. Consequently, the first alloy member may comprise a mixture of in excess of 11 atom percent of germanium. A suitable alloy comprises 20 atom percent of germanium, the balance being indium. The first alloy member should be of a shape and size that it may be laid upon the evaporated layer so that all portions thereof are separated by a space, for example, from 5 to 10 mils or more, from the periphery of the evaporated and diffused impurity material layer. Usually, a margin of from 10 to 50 mils is provided between the periphery of the first alloy member and the evaporated and diffused layer in making conventional transistors. For phototransistors, however, the smallest sized pellet of the first alloy to which a lead can be attached is applied to provide for a simple ohmic contact well within the evaporated layer.

The second alloy member is prepared from a composition comprising the semiconductor material and any one of the doping impurity materials in such proportions that the liquidus temperature is below the first diffusion temperature. Thus, for a 500° C. diffusion temperature, the second alloy may be prepared from indium and germanium in the proportions of 10 atom percent or less of germanium. Furthermore, the second alloy member may comprise additional components including either doping impurity materials or non-doping materials, such as silver, gold or gallium, which will reduce the melting point.

In addition, an ohmic contact to function as a base contact may be prepared from a neutral solder or a solder having the same type of semiconductivity as the body of the semiconductor wafer. The solder may be employed alone to produce a base contact, or it may be applied to a ring of a higher melting metal. The solder should have a melting point substantially below the first diffusion temperature.

The semiconductor wafer having the diffused evaporated layer therein is assembled with the first alloy member disposed on said diffused layer, the second alloy member is disposed on another surface of the semiconductor wafer, ordinarily immediately below the diffused layer, and the base contact is applied adjacent to but separated from the diffused layer. This assembly is then subjected to heat in a vacuum or in a protective atmosphere to bring it to a temperature above the liquidus temperature of the second alloy member but below the first diffusion temperature. A light weight may be applied to the surfaces to assist in metallurgical bonding therebetween. When so heated, the first alloy member will fuse to the evaporated diffused layer without changing the composition of any portion of said layer. At the most, some of the semiconductor material may be precipitated from the first alloy member on the diffused layer. The second alloy member will melt and fuse with and penetrate the semiconductor material. The second alloy member usually will be of considerably larger area than the vaporated and diffused layer. The base contact solder will fuse to the semiconductor member. Upon cooling at room temperature, the resulting semiconductor device may be provided with leads which may be readily soldered or fused to the first alloy member, the second alloy member and the base contact. The first alloy member and the evaporated layer will function as the emitter. the second alloy member will function as the collector of the semiconductor device.

Figure 1:
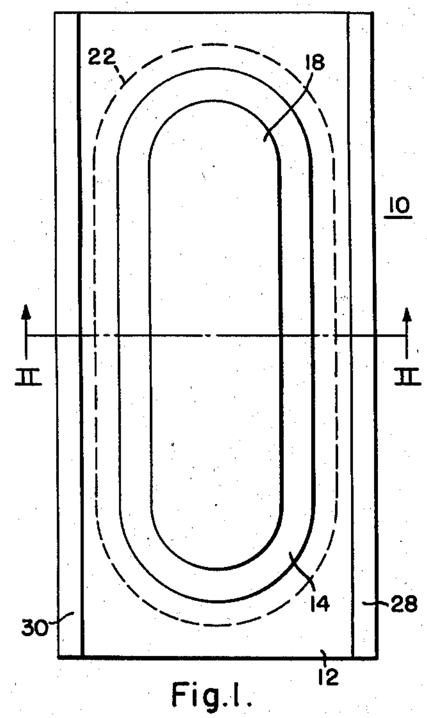
Fig. 1 is a top planar view of a transistor constructed in accordance with the invention.

Referring to Figs. 1 and 2 of the drawing, there is illustrated a semiconductor transistor 10 produced in accordance with the invention. The transistor 10 comprises a wafer 12 of a semiconductor material, such, for example, as N-type germanium. An evaporated layer 14 of a thickness of less than 1 mil of a P-type doping impurity material, such as indium, is applied to the upper surface of the wafer 12. It will be observed that the layer 14 has diffused to a depth represented by line 16 in the upper surface of the wafer 12. The wafer depth to line 16 will have P-type semiconductivity. A planar P–N junction exists at the interface in the wafer 12 represented by line 16. A first alloy member 18 is fused to the layer 14 to provide an ohmic contact therewith and a lead 20 is affixed to the layer 18. Fused to the bottom surface of the wafer 12 is a collector layer 22 of such a size that the projection of the layer 14 thereon is well within its periphery. Diffusion has taken place to provide a P-type layer 24 immediately above the collector layer 22. A uniform spacing is present between the layer 14 and the upper surface of the layer 24. A lead 26 is affixed to the collector 22. On the upper surface of the wafer 12 are placed two soldered base contacts 28 and 30 with leads 32 and 34 attached thereto. The base contacts 28 and 30 may be connected in parallel by joining the electrical leads 32 and 34, or they may be separately energized.

Figure 3:
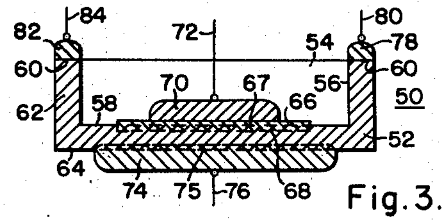
Fig. 3 is a cross section through a grooved transistor device.

In order to provide for more durable semiconductor devices, it may be desirable to employ a grooved semiconductor wafer construction 50 as shown in Fig. 3 of the drawing. The detailed preparation of grooved semiconductor wafers is disclosed in application Serial No. 569,657, filed March 5, 1956, and assigned to the assignee of this present invention. Reference is made to that application for details of the preparation of grooved wafer members. Briefly, a relatively thick semiconductor wafer 52 is machined by lapping the upper surface thereof to produce a completely enclosed groove 54 having a bottom surface 58 substantially parallel to the lower surface of the semiconductor wafer. Substantially vertical side walls 56 extend from the bottom surface 58 to the upper surface 60. Thus, the bottom of the groove may be less than a mil from the lower surface of the wafer. Relatively thick walls 62 of the wafer surrounding the groove 54 provide for adequate strength and rigidity for practical uses thereof.

The grooved wafer 52 of Fig. 3 of the drawing is provided with an evaporated layer 66 of the doping impurity material of a semiconductivity opposite to the type of semiconductivity present in the body of the wafer. The layer 66 is deposited on the bottom surface 58 and is heated to a temperature to cause diffusion of the doping material into the adjacent surface of the semiconductor material. This produces a diffused layer 67 extending a short distance into the surface of the wafer which has a conductivity opposite to that of the rest of the wafer, and a planar P–N junction 68 exists between the layer 66—67 and the body of the semiconductor wafer. A first alloy member 70 is applied to the layer 66 and to it is affixed a lead 72. A collector 74 comprising a second alloy member is applied and fused to the lower surface 64 of the semiconductor wafer. A P–N junction 75 substantially parallel to and equidistant to the P–N junction 68 is produced. A lead 76 is attached to the layer 74. At the upper surfaces 60 are soldered base contacts 78 and 82 to which are attached terminals 80 and 84, respectively.

Figure 4:
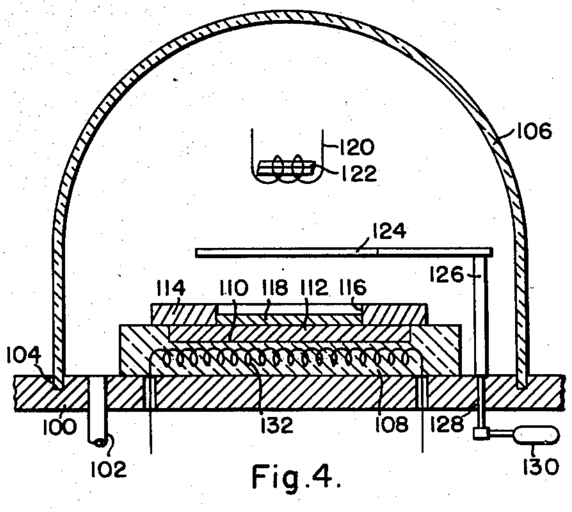
Fig. 4 is a vertical cross section through an evaporation device.
Figure 5:
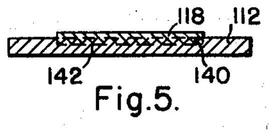
Figs. 5 through 7 are vertical cross sections through a transistor showing progressive stages in its manufacture.

Referring to Figs. 4 to 7 of the drawing, there is illustrated a sequence of steps followed in producing the semiconductor devices as shown in Figs. 1 and 2 of the present invention. In Fig. 4 is shown an evaporator device comprising a base 100 through which passes a conduit 102 leading to a vacuum pump and a source of gas atmosphere which may be controlled by valves (not shown). Sealing grooves 104 in the base 100 are provided to hold a glass bell jar 106 within which a vacuum may be produced. A support 108 of graphite or other suitable material is provided with a recess 110 within which is disposed a semiconductor wafer 112. A mask 114 is placed upon the wafer 112, the mask having an aperture 116 determining the area of the wafer to be provided with an evaporated coating 118 of doping impurity material. A filament 120 of tungsten or the like is suitably supported within the bell jar 106 at a point above the aperture 116. The heating coil 120 of tungsten retains a member 122 of doping impurity material. A shield 124 is interposed between the coil 120 and the aperture 116. The shield 124 is mounted on a shaft 126 passing through a vacuum-tight connection 128 through the base 100. It is manually operable by the handle 130 to be moved into such interposing position or to be moved out of this position to a point where it no longer interferes with the flow of evaporated material to the aperture 116. After evaporation of a suitably thick layer 118 of the doping impurity on the wafer 112, the support 108 may be heated to a temperature suitable to melt and diffuse the layer 118 thereon by energizing coil 132 disposed therein. As illustrated in Fig. 5 of the drawing, after such heating, the upper surface of wafer 112 has been penetrated by diffusion of a part of the layer 118 to produce a P-type layer 140 within the upper surface thereof adjacent layer 118. A P–N junction 142, which is substantially planar, results.

Figure 6:
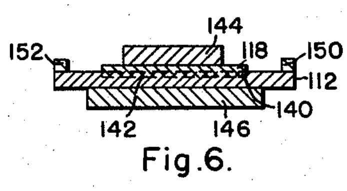
Figure 7:
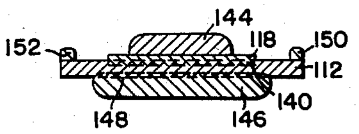

Thereafter, a first alloy member 144 of an area smaller than the layer 118 is symmetrically located on the layer 118. A second alloy member 146 larger than the layer 118 is symmetrically disposed on the lower surface of the wafer, and solderable base contacts 150 and 152 are applied to the upper surface of the wafer 112, as illustrated in Fig. 6. The assembly is heated under vacuum to a temperature below the diffusion temperature, for example 50° C. lower, but above the melting point of the solder alloy 144 and the second alloy member 146. As illustrated in Fig. 7 of the drawing, metallurgical bonding takes place between the alloy member 144 and layer 118. The second alloy member 146 has melted and diffused into the bottom of the member 112 to produce a diffusion layer 148. Similarly, the solder of base contacts 150 and 152 has melted and bonded to the semiconductor 112. Thereafter, terminals soldered or otherwise applied to the members 144 and 146 are also attached to the base contacts 150 and 152 to produce a transistor similar to that shown in Fig. 1.

Figure 8:
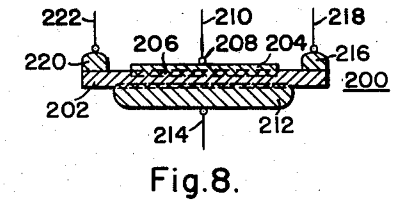
Fig. 8 is a vertical cross-sectional view of a phototransistor constructed in accordance with the invention.

As illustrated in Fig. 8 of the drawing, a phototransistor 200 is prepared in a manner similar to that shown in Figs. 4 through 7 with the exception of the shape and size of the emitter contact member. The phototransistor 200 comprises a semiconductor member 202 on which is an evaporated layer 204 of doping impurity fused and diffused thereinto to provide a P–N junction 206. The layer 204 is of a thinness of the order of 0.00001 inch and is relatively transparent to light. A contact member 208 is fused to a small portion of the surface only of the layer 204 to provide an ohmic emitter contact to which a lead 210 is attached. A collector contact 212 is fused to the opposite or lower surface of the wafer 202 and is provided with a terminal 214. Base contacts 216 and 220 provided with leads 218 and 222, respectively, are attached to the upper surface of the wafer in the manner previously disclosed.

In preparing the semiconductor members of the invention, it has been found that the second alloy members for the collector junction may comprise additional components, such as gold or silver, for example, in amounts of up to 15%, to aid in wetting the semiconductor member. On occasion, the collector junction area on the semiconductor has been treated by evaporating thereon a very thin film of gold of a thickness of less than 1 mil before applying the second alloy member thereto. The base contact may comprise nickel-clad molybdenum members which are tinned with solder comprising pure tin or lead-tin alloy. In some cases, a base contact may comprise a tinned pure nickel alloy. In other cases, a preformed member of lead-tin solder has been employed as the base contact. Silver and silver base alloys form excellent base contacts.

It will be understood that the semiconductor members can be etched with conventional etching materials, particularly after having been completely fused in order to post-etch the surface to improve the properties.

Semiconductor devices prepared from germanium wafers similar to those shown in Figs. 1 and 2 were prepared from germanium wafers of a thickness of approximately 0.007 inch by a length of ⅞ inch and a width of ¼ inch. The evaporated emitter terminal was of oblong shape of dimensions of 11/16 inch by a width of 3/32 inch. An emitter contact junction of an alloy of indium and germanium (20 atom percent) of a dimension of ⅝ inch by 1/16 inch was applied to the evaporated emitter terminal. The collector junction terminal comprising an alloy of germanium and indium of a composition of 8 atom percent of germanium, the balance being indium, was applied over an area of ¾ inch by ⅛ inch on the bottom surface of the germanium wafer. Two parallel base contacts of a width of approximately 1/16 inch were applied to the two parallel sides of the wafer. The evaporated emitter layer was fused and diffused at a temperature of 450° C. However, other transistors were fused at temperatures between 400° C. and 500° C. The second heating to fuse the collector contact and the base contact, as well as the emitter junction contact, was carried out at temperatures approximately 100° C. lower. The transistors were tested and found to have high gains of from 30 to 45 at emitter currents of from 10 milliamperes to over 150 milliamperes. The current gain curve was relatively flat over a large proportion of the emitter current.

It will be understood that the above detailed description and drawing are illustrative and not limiting.

We claim as our invention:

1. In the process of producing a semiconductor device, the steps comprising evaporating a thin layer of a thickness of substantially less than 0.001 inch of a doping impurity material upon one surface of a solid semiconductor member, the semiconductor member having the opposite type of semiconductivity, heating the semiconductor member and the applied layer of doping material to a first temperature above the fusion temperature of the doping impurity material to fuse the layer of doping impurity material and to diffuse the doping impurity material into the adjacent surface of the semiconductor member to convert the semiconductor material at the surface to the opposite type of conductivity and thereby providing a substantially planar P–N junction, applying to the fused layer of doping impurity material a first alloy member comprising both the semiconductor material and the doping impurity material in such proportions that the liquidus temperature thereof is not less than said first temperature, heating the semiconductor member and the applied first alloy member to fuse the contacting surface of the alloy member without melting either the body of the alloy member or any substantial portion of the previously evaporated layer of impurity material while maintaining a temperature below said first temperature to unite the first alloy member by metallurgical bonding to the layer of impurity material by fusion at the contacting surfaces only, the fused alloy member being disposed entirely within the surface of the evaporated layer of the doping impurity material, the fused alloy member providing for an emitter contact, applying to another surface of the semiconductor member a second alloy member comprising both the semiconductor material and the doping impurity material in such proportions that the liquidus temperature thereof is below said first temperature, heating the semiconductor member and said second alloy member to a temperature above its liquidus temperature, but not exceeding the second temperature to fuse the second alloy member to the semiconductor member surface and to diffuse into said last surface to convert the semiconductivity of the semiconductor at said last surface to the opposite type to produce a second P–N junction, the second alloy member providing for a collector contact, and fusing a base contact to another surface of the semiconductor member at a temperature not exceeding the second temperature.

2. The process of claim 1, wherein the first alloy member, the second alloy member and the base contact are applied and heated simultaneously at the said second temperature.

3. The process of claim 1, wherein a thin film of gold is evaporated on said another surface of the semiconductor member and the second alloy member is applied to the evaporated film of gold.

4. The process of claim 1 wherein the said another surface is directly below the surface on which the emitter is present, and the projection of the fused layer of emitter contact thereon is well within the periphery of the collector contact.

5. The process of claim 1, wherein the evaporated layer of doping impurity is of a thickness of from 0.0001 to 0.00001 inch, and the first alloy member is applied to only a small area of the fused layer, whereby a phototransistor is produced.

6. In the process of producing a semiconductor device, the steps comprising evaporating a thin film of at least one doping material from the group consisting of indium, aluminum and gallium on a surface of a solid semiconductor member having N-type semiconductivity, the evaporated film being of a thickness of the order of from 0.0001 to 0.00001 inch, heating the semiconductor member to a first temperature above the melting point of the applied doping material, whereby to fuse the applied layer of doping material to the adjacent surface of the semiconductor member and to diffuse therein whereby to convert such adjacent surface to P-type semiconductivity whereby to provide a substantially planar P–N junction, producing an assembly by (1) applying upon the fused layer a first alloy member comprising the doping material and the semiconductor material in such proportions that its liquidus temperature is above the first temperature, the first alloy member being well within the periphery of the fused layer, (2) applying to the opposite surface of the semiconductor member a second alloy member comprising the doping material and the semiconductor material in such proportions that its liquidus temperature is below the said first temperature, and (3) applying to the semiconductor member a base contact comprising a solder melting below the first temperature that will not change the N-type conductivity of the semiconductor member, the base contact being applied to surfaces of the semiconductor member adjacent the fused evaporated layer, and heating the assembly to a temperature below said first temperature and above the melting temperature of the solder to fuse only the contacting surface of the first alloy member only to the surface of the fused evaporated layer to provide an emitter contact without disturbing the characteristics of the fused layer, to melt and fuse the second alloy member to the opposite surface of the semiconductor member and to diffuse therein whereby to provide for P-type semiconductivity therein thereby providing a P–N junction, the second alloy member providing a collector contact, and to fuse the base contact to the semiconductor member.

7. The process of claim 6, wherein the semiconductor member is provided with a groove having a lower surface parallel to the bottom surface of the semiconductor member, the evaporated layer being applied to the lower surface within the groove, the second alloy member is applied to the bottom surface of the semiconductor member, and the base contact is applied to the upper surface of the semiconductor member adjacent the groove walls.

8. The process of claim 6 wherein the first alloy member is sufficient to provide an ohmic contact to the fused layer and to attach a current terminal thereto, a high proportion of the fused layer being exposed whereby to provide a phototransistor.

References Cited in the file of this patent

UNITED STATES PATENTS

| | | |
|---|---|---|
| 2,709,232 | Thedieck | May 4, 1955 |
| 2,736,847 | Barnes | Feb. 28, 1956 |
| 2,742,383 | Barnes et al. | Apr. 17, 1956 |
| 2,757,324 | Pearson | July 31, 1956 |
| 2,759,133 | Mueller | Aug. 14, 1956 |
| 2,780,569 | Hewlett | Feb. 5, 1957 |
| 2,781,481 | Armstrong | Feb. 12, 1957 |

FOREIGN PATENTS

| | | |
|---|---|---|
| 730,123 | Great Britain | May 18, 1955 |
| 163,891 | Australia | July 5, 1955 |